United States Patent
Pradeep

(10) Patent No.: US 10,473,717 B2
(45) Date of Patent: Nov. 12, 2019

(54) METHODS AND APPARATUS FOR TEST INSERTION POINTS

(71) Applicant: Texas Instruments Incorporated, Dallas, TX (US)

(72) Inventor: Wilson Pradeep, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 42 days.

(21) Appl. No.: 15/347,619

(22) Filed: Nov. 9, 2016

(65) Prior Publication Data

US 2018/0128877 A1 May 10, 2018

(51) Int. Cl.
*G01R 31/317* (2006.01)
*G01R 31/3177* (2006.01)
*G01R 31/3185* (2006.01)
*G01R 31/3183* (2006.01)

(52) U.S. Cl.
CPC ... *G01R 31/31707* (2013.01); *G01R 31/3177* (2013.01); *G01R 31/31723* (2013.01); *G01R 31/318547* (2013.01); *G01R 31/318385* (2013.01)

(58) Field of Classification Search
CPC .......... G01R 31/31707; G01R 31/3177; G01R 31/31723; G01R 31/318547; G01R 31/318385
See application file for complete search history.

(56) References Cited

U.S. PATENT DOCUMENTS

| | | | |
|---|---|---|---|
| 5,254,942 A * | 10/1993 | D'Souza | G01R 31/31858 324/73.1 |
| 5,381,421 A * | 1/1995 | Dickol | G01R 31/31713 714/736 |
| 5,619,512 A * | 4/1997 | Kawashima | G01R 31/318385 714/718 |
| 6,134,517 A | 10/2000 | Baxter et al. | |
| 6,662,326 B1 * | 12/2003 | Schober | G01R 31/318505 714/733 |
| 6,760,873 B1 * | 7/2004 | Hao | G01R 31/3016 324/73.1 |
| 6,915,468 B2 * | 7/2005 | Chambers | G01R 31/31813 714/719 |
| 6,950,974 B1 * | 9/2005 | Wohl | G01R 31/318547 714/728 |
| 2007/0113123 A1 * | 5/2007 | Crouch | H04L 45/60 714/724 |
| 2008/0022168 A1 * | 1/2008 | Chang | G01R 31/31722 714/724 |

OTHER PUBLICATIONS

"IEEE Standard Test Access Port and Boundary-Scan Architecture," IEEE Std. 1149.1-2001, Test Technology Standards Committee of the IEEE Computer Society, 2001, pp. 1-208, The Institute of Electrical and Electronics Engineers, Inc., New York, NY, accessed Nov. 9, 2016, http://fiona.dmcs.pl/~cmaj/JTAG/JTAG_IEEE-Std-1149.1-2001.pdf.

* cited by examiner

*Primary Examiner* — Cynthia Britt
(74) *Attorney, Agent, or Firm* — Ebby Abraham; Charles A. Brill; Frank D. Cimino

(57) ABSTRACT

Described examples include a method of providing K bits of test data to a combinatorial circuit. The method further includes generating N bits of test data using the combinatorial circuit, where N is greater than K. The method further includes providing the N bits of test data to a module under test.

14 Claims, 5 Drawing Sheets

| MODE | TEST COVERAGE % | PATTERN COUNT | CONTROL SCAN FLOPS | SEQUENTIAL AREA ($\mu m^2$) | COMBINATIONAL AREA ($\mu m^2$) | TOTAL AREA ($\mu m^2$) |
|---|---|---|---|---|---|---|
| 1:1 MODE | 92.82% | 2217 | 5808 | 40144.9 | - | 40144.9 |
| 1:M MODE ('P'=500 \|'M'=12 ) | 92.53% | 2603 | 500 | 3456 | - | 3456 |
| 1:M MODE ('P'=12 \|'M'=500 ) | 88.98% | 2649 | 12 | 82.944 | - | 82.944 |
| XOR SPREADER MODE_1 (K=500) | 92.81% | 2530 | 500 | 3456 | 6667.1 | 10123.1 |
| XOR SPREADER MODE_1 (K=50) | 92.80% | 2591 | 50 | 345.6 | 701.2 | 1046.8 |
| XOR SPREADER MODE_1 (K=5) | 92.80% | 2647 | 5 | 34.56 | 62.6 | 97.16 |

METHODS AND APPARATUS FOR TEST INSERTION POINTS

TECHNICAL FIELD

This application relates generally to circuit testing, and, in particular, to methods and circuits for inserting test data and observation points to modules.

BACKGROUND

Beginning in 1985, several European and North American companies banded together to form the Joint Test Action Group (JTAG). The stated task was to solve the problem of printed-circuit board (PCB) manufacturing test, which was growing more difficult as integrated circuits (ICs) became smaller and more complex. The solution was eventually standardized as the IEEE Standard 1149.1-1990 Test Access Port and Boundary-Scan Architecture, which is hereby incorporated herein in its entirety by reference. This industry standard provides for inclusion of required test resources into ICs.

Boundary-scan builds on the concepts of in-circuit test. In boundary scan, physical probes ("nails") which are placed mid-net in probe test technology, are replaced by boundary-scan cells (BSCs). These "virtual" probes are placed on-chip at IC inputs and IC outputs (the boundary of the IC), and are therefore placed at the net ends. The use of boundary scan testing results in two major improvements: (1) physical access is no longer required at boundary-scan nets, and (2) continuity test is no longer subject to IC complexity. The result is that the goal of manufacturing test, to isolate defects to a pin or net, can be accomplished by highly automated test-pattern generation (ATPG).

To provide a means to arbitrarily control and observe these BSCs with minimal pin overhead, the BSCs were designed to be serially chained to form a shift register between two IC pins, Test Data Input (TDI) and Test Data Output (TDO). Additional control structures required to select between normal and test operational modes were also been designed to minimize pin overhead and to maximize flexibility to handle test modes in addition to tests used for PCB manufacturing test. The Test Access Port (TAP) is based on a state machine (TAP Controller) that operates synchronously to a Test Clock (TCK, to which all operations of the test logic are synchronous) and under the control of a single Test Mode Select (TMS). The TAP Controller explicitly provides for a single instruction register that controls the test modes and for any number of test data registers (including the boundary-scan register) that are selected by specific instructions.

Standardization of the TAP and TAP Controller, as well as the boundary-scan architecture, has been key to the broad acceptance of the technology across IC, tester, and computer-automated engineering (CAE) tool vendors. This structured design-for-test (DFT) technique is used widely across all types of board designs by all sorts of board manufacturers, even those where catalog ICs and off-the-shelf testers and tools are used. Additionally, the flexibility of the TAP and TAP Controller allows access to other test features built into chip, board, or system, such as on-chip scan test or built-in self-test (BIST).

Rapid integration has placed more functionality from separate integrated circuits onto one integrated circuit or modules containing multiple integrated circuits. The integrated circuits and modules have become enormously complex. The increased complexity makes thorough testing of all functionality using scans at the boundary of such devices difficult, if not impossible. However, thorough testing is essential. For example, with automotive devices, failures can have severe safety consequences. In automotive devices it is important that high test-coverage is achieved for both static and dynamic faults, while still keeping the test-cost under control to meet the stringent safety standards.

However, the presence of modules containing random resistant faults that impact the controllability and observability of the test make the requirement to thoroughly test challenging. In addition, digital analysis cannot test random access memory (RAM) or analog modules. The inputs and outputs of RAM are not deterministic, and analog modules have either non-digital inputs or outputs. Solutions to mitigate these issues are usage of control/observe test-point insertion around these untestable modules to improve controllability and observability of the test.

SUMMARY

In accordance with an example aspect of the present application, a method includes providing K bits of test data to a combinatorial circuit. The method further includes generating N bits of test data using the combinatorial circuit, where N is greater than K. The method further includes providing the N bits of test data to a module under test.

DETAILED DESCRIPTION

Corresponding numerals and symbols in the different figures generally refer to corresponding parts unless otherwise indicated. The figures are not necessarily drawn to scale.

The term "coupled" may include connections made with intervening elements, and additional elements and various connections may exist between any elements that are "coupled."

Figure 1:
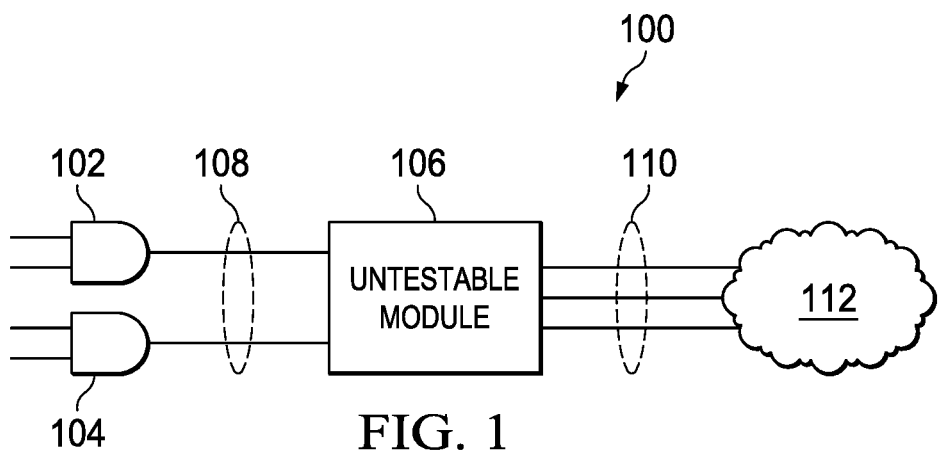
FIG. 1 is a schematic diagram of a portion of a circuit.

FIG. 1 is a schematic diagram of a portion of a circuit 100. Circuit 100 includes upstream circuit elements 102 and 104 that provide inputs to untestable module 106. Untestable module 106 receives inputs 108 from circuit elements 102 and 104 and provides outputs 110 to the rest of the circuit as symbolized by cloud 112.

Untestable module 106 does not operate in a manner that is amenable to scan testing, such as boundary scan testing. Example untestable modules include: memory devices such as RAM; analog modules; content addressable memory modules; and modules with hysteresis where the current behavior depends on a history of prior states. In testing using ATPG tools, these modules are generally treated as a black box or empty module. Thus, automated test-pattern generation (ATPG) cannot test an untestable module. Module 106 may be untestable because of design. For example, modules that include memory may have an output that is dependent upon what is stored in that memory. Thus, the current output is not solely dependent upon the current inputs. Also, certain state machines may provide differing outputs based on an internally stored state. These types of devices must be tested using specialized mechanisms. However, to provide complete test coverage to those modules including other modules coupled to the untestable module 106 so that boundary scan techniques can test them, the inputs to and the outputs from untestable module 106 must be accounted for.

Figure 2:
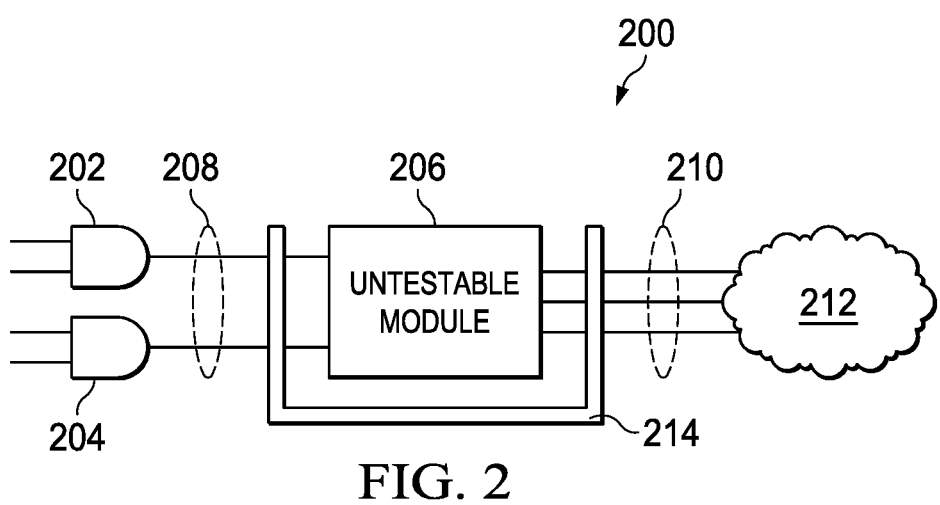
FIG. 2 is a schematic diagram of the circuit of FIG. 1 including design for test (DFT) logic.

FIG. 2 is a schematic diagram of a circuit similar to the circuit of FIG. 1 including design for test (DFT) shadow logic. Similarly labeled elements of FIG. 2 perform similar functions to those of FIG. 1, for clarity. That is, elements 202, 204, 206, 208, 210 and 212 perform similar functions to elements 102, 104, 106, 108, 110 and 112, respectively, in FIG. 1. One conventional technique for addressing the problem of untestable modules is the insertion of DFT shadow logic 214. DFT shadow logic 214 includes scannable elements positioned around the module. During testing, DFT shadow logic intercepts the inputs 208 to untestable module 206. DFT shadow logic 214 includes deterministic logic to produce pseudo outputs of untestable module 206 as outputs 210. This allows the test designer to provide knowable outputs. This enhances the testability of circuit 200 over circuit 100. However, the range of outputs 210 is limited by the inputs 208. Thus, in certain circumstances, the DFT shadow logic 214 may not be able to provide the outputs necessary to fully test the circuitry of cloud 212.

Figure 3:
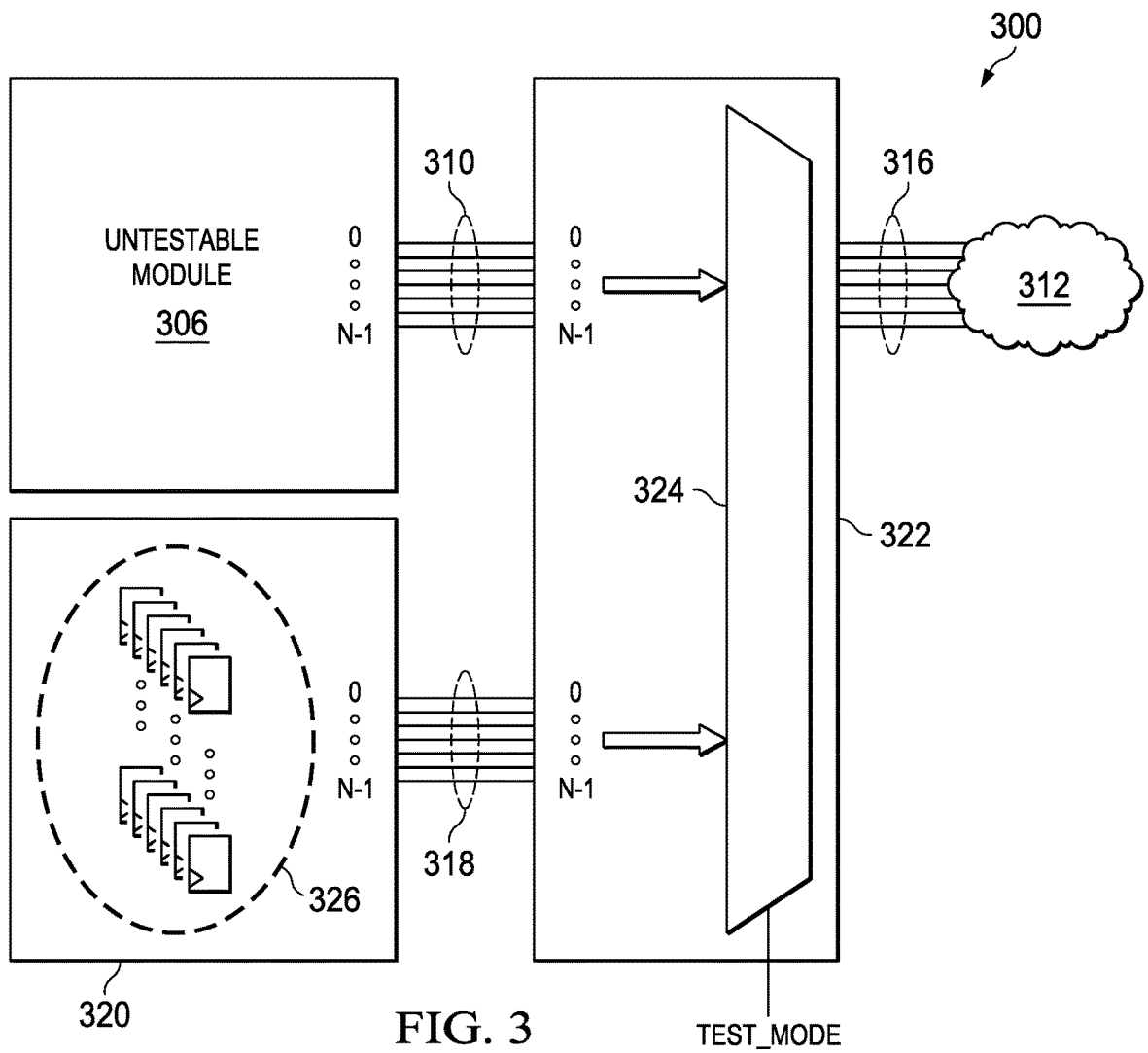
FIG. 3 is a schematic diagram of a circuit with internal boundary scan circuitry.

FIG. 3 is a schematic diagram of a circuit 300 with internal boundary scan circuitry. Similarly labeled elements of FIG. 3 perform similar functions to those of FIG. 1. That is, elements 306 and 312 perform similar functions to elements 106 and 112, respectively, in FIG. 1. Circuit 300 includes insertion point 322 between untestable module 306 and the rest of the circuit represented by cloud 312. Typically an ATPG tool identifies control/observe test-points by random resistance fault analysis (RRFA) and deterministic fault analysis (DFA). Also, custom user defined test-points are provided for cases such as black-boxes and non-scannable logic.

Insertion point 322 includes a multiplexor 324. In normal mode, outputs 310 pass through multiplexor 324 as inputs 316 to the downstream circuitry of cloud 312. In test mode, multiplexor 324 connects test inputs 318 to inputs 316. An ATPG tool generates test inputs 318 and provides test inputs 318 to test module 320 via a serial input port (not shown). Test module 320 provides N inputs to match the N outputs of untestable module 306. However, to provide N test inputs 318, each bit from (0–N−1) must be latched into one of flip-flops ("flops") 326. Each flop requires several transistors to implement and adds a significant amount of valuable area on the integrated circuit. The flops use silicon area dedicated to testing that does not increase the functionality of the integrated circuit in normal mode.

Figure 4:
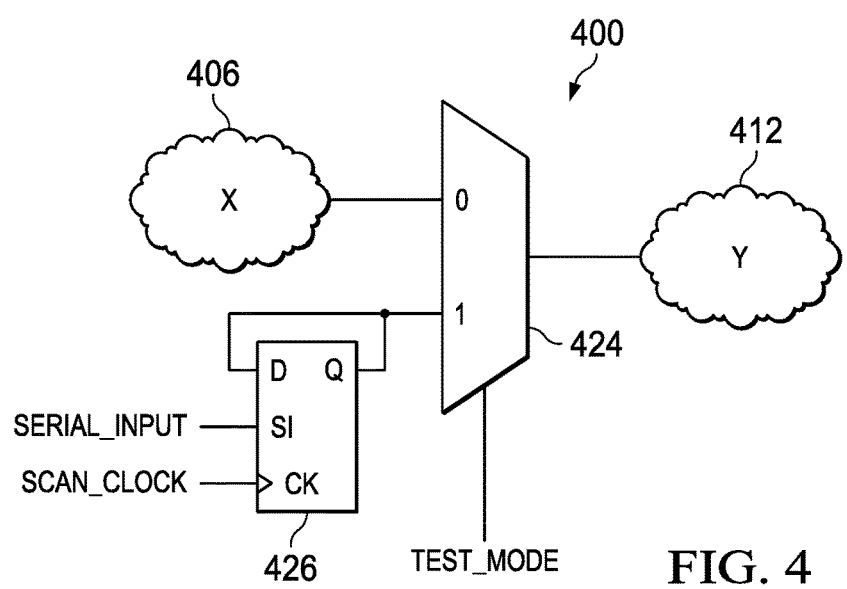
FIG. 4 is a schematic diagram of one bit of a test insertion point.

FIG. 4 is a schematic diagram of one bit of an insertion point 400. Multiplexor 424 selects between providing the output of circuit 406 or the output of flop 426 based on the TEST_MODE input. Multiplexor 424 is one bit of a larger multiplexor, such as multiplexor 324 (FIG. 3). Flop 426 is a scan cell. Test inputs are provided on the Serial_Input (SI) of flop 426. Not shown in FIG. 4 is a serial output that provides the serial input to the next flop in a scan chain of similar flops. Flop 426 is one bit of a serial register that is loaded with a test vector in serial fashion. Multiplexor 424 and the D input of flop 426 receive the Q output of flop 426. Circuit 412 receives the Q output of flop 426 via multiplexor 424 during test mode.

In operation, flop 426 stores one bit of the test vector until a new bit is loaded via the serial input SI. Each flop in the scan chain (not shown) includes 8 to 10 transistors plus associated control circuitry. Therefore, the area consumed to store N bits of test input data is very large. In addition, in most integrated circuits or modules, there will be many test insertion points, thus multiplying the space consumed by test circuitry. For analog modules, which are generally not testable using ATPG, the number of output ports to be made controllable is significantly higher other types of modules. For this type of circuit, providing the entire test vector for an untestable module becomes a significant implementation of test circuitry. The test circuitry has to provide all output values to the surrounding circuits.

Figure 5:
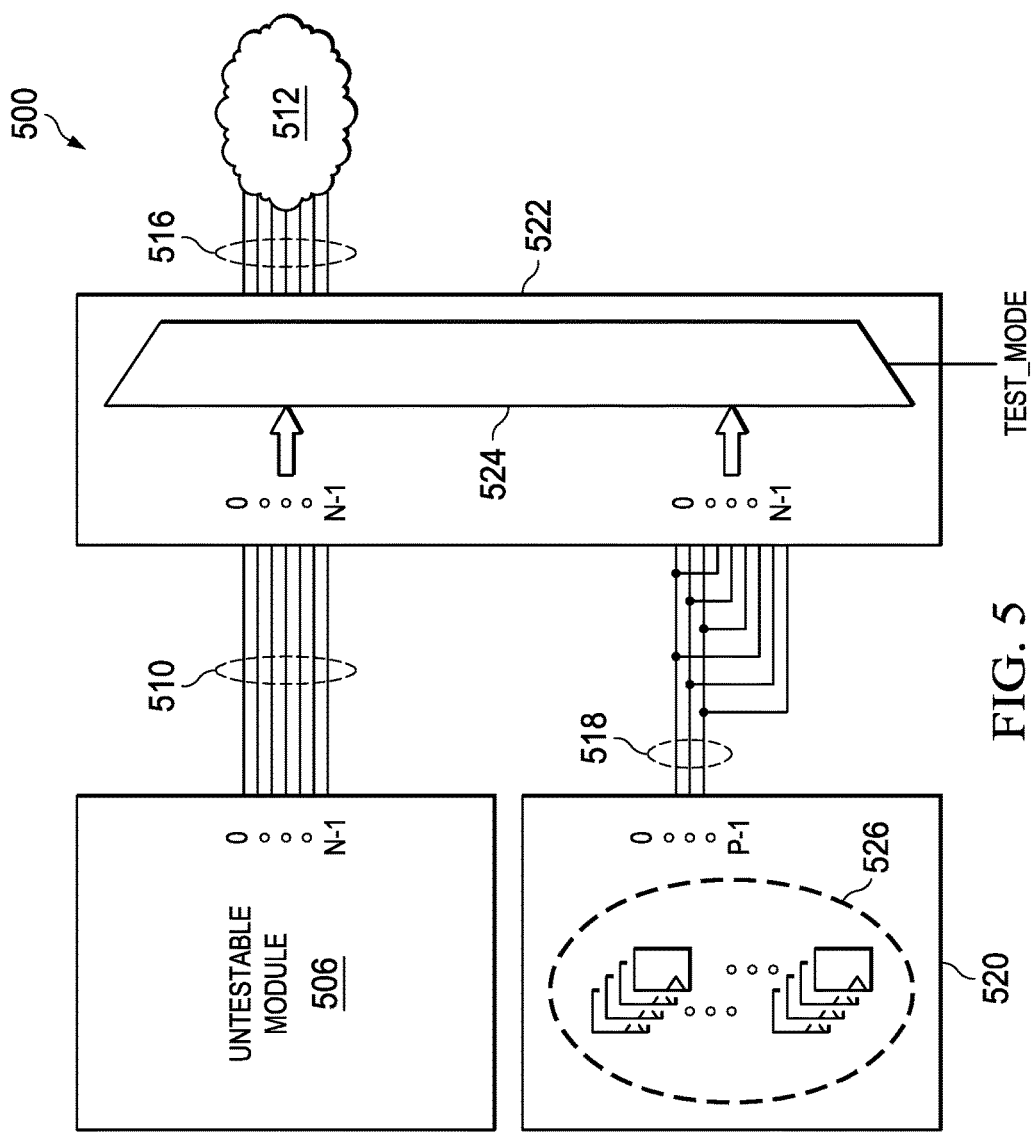
FIG. 5 is a schematic diagram of a circuit including one way of reducing the number of stored test vector bits.

FIG. 5 is a schematic diagram of a circuit including one conventional way of reducing the number of stored test vector bits. Similarly labeled elements of FIG. 5 perform similar functions to those of FIG. 3. That is, elements 506, 510, 512, 516, 522 and 524 perform similar functions to elements 306, 310, 316, 312, 322 and 324, respectively, in FIG. 3. In circuit 500, test module 520 provides P outputs, where P is less than N. In the example of circuit 500, each line 518 connects to three test inputs of multiplexor 522. In other configurations, some lines may be connected to more of the N inputs than others. That is, one output connects to X lines while other outputs connects to Y outputs. The reduction of the number of test module outputs reduces the number of flops 526 in this example by one third. However, using the structure of circuit 520 causes a large degradation in the quality of test results due to a bit correlation effect (peak test-coverage and pattern count) when P is much smaller than N. In addition, use of structure 520 increases routing overhead and congestion, as a single test module output must be routed to multiple test-point locations.

Figure 6:
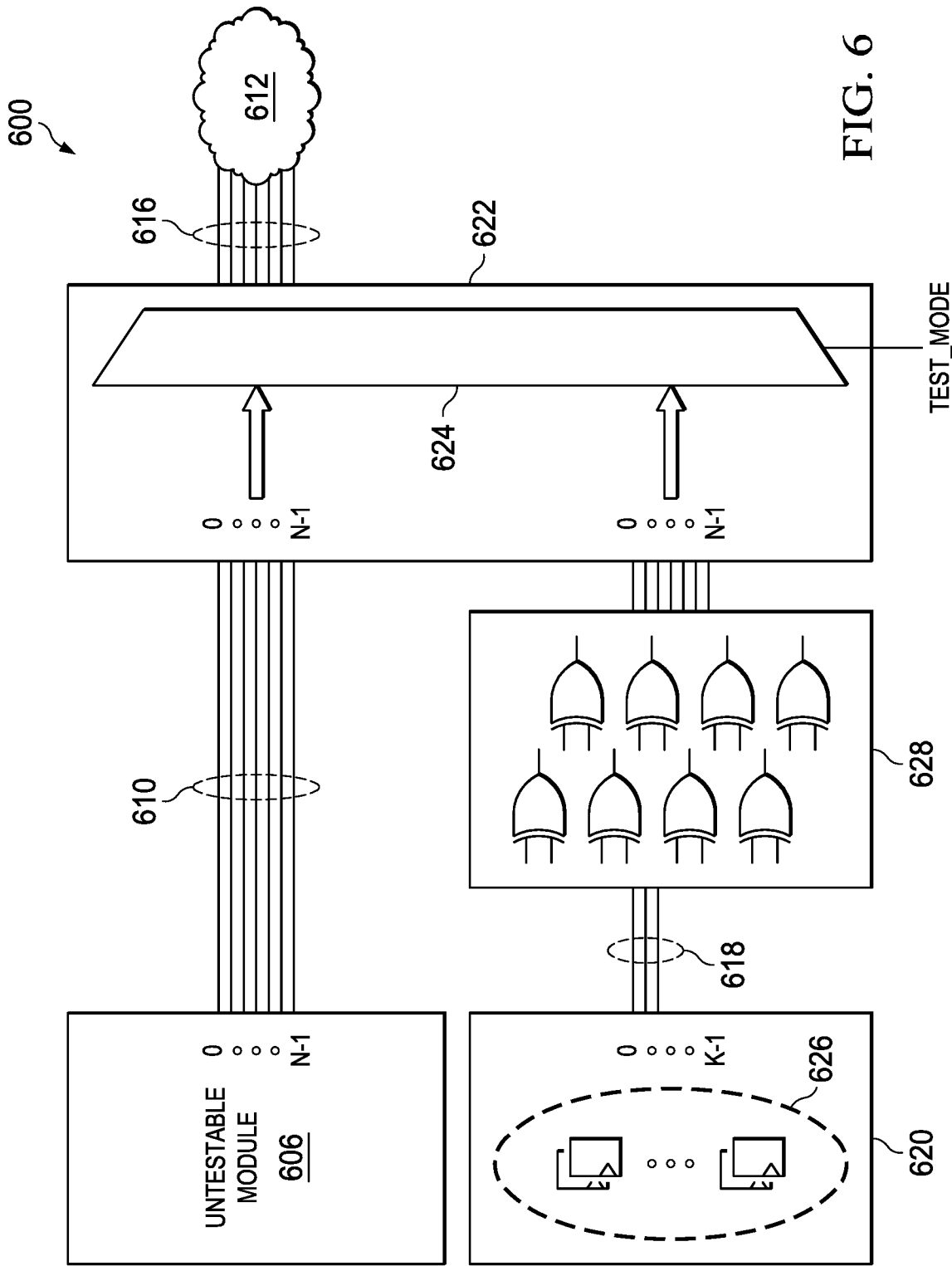
FIG. 6 is a schematic diagram of a circuit 600 including a test vector insertion scheme aspect of the present application.

FIG. 6 is a schematic diagram of a circuit 600 including an aspect test vector insertion scheme. Similarly labeled elements of FIG. 6 perform similar functions to those of FIG. 5. That is, elements 606, 610, 612, 616, 622 and 624 perform similar functions to elements 506, 510, 512, 516, 522 and 524, respectively, in FIG. 5. In circuit 600, test module 620 only provides K outputs 618, where K is less than N. Thus, test module only includes K flops 626. Outputs 618 are provided to XOR spreader 628. XOR spreader 628 includes a plurality of gates in a configuration based on a user defined randomization function. In this example, the gates are XOR gates, but other types and combinations of logical gates may be effectively employed. The randomization function can be based on a phase shifter logic. The desired range of test vectors to be applied to circuit 612 determines the randomization function. This range of test vectors will vary based on the functionality of circuit 612. XOR spreader 628 receives K test input signals from test module 620 to create a randomization to provide N outputs as needed for the N-bit test vector. In another aspect, an XOR_ENABLE signal (not shown) can be provided to dynamically shift between XOR spreader mode and a 1:M broadcast mode (such as that shown in FIG. 5).

Figure 7:
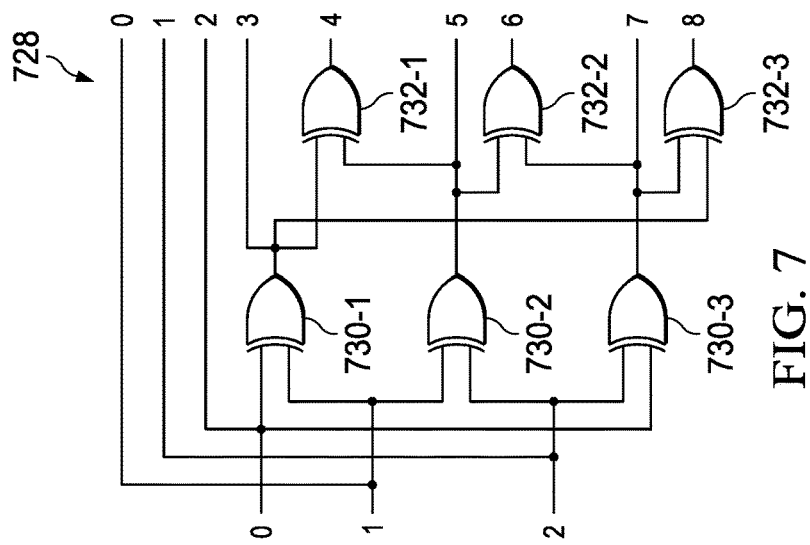
FIG. 7 is a schematic diagram of an example combinatorial spreader.

FIG. 7 is a schematic diagram of an example combinatorial spreader 728, which is one example implementation that can be used to form XOR spreader 628 of FIG. 6. Spreader 728 is an XOR based spreader with two levels of XOR gates. The first level of gates includes XOR gates 730-1, 730-2 and 730-3. The second level of gates includes XOR gates 732-1, 732-2 and 732-3. The XOR based spreader logic takes the K inputs from the control scan flops and creates a randomization to provide N outputs as needed for N test-points. Spreader 728 is a simple circuit that accepts three inputs (e.g., K=3, so the inputs are indexed from 0–(K–1), that is 0, 1, 2) and provides nine outputs (N=9, the inputs are indexed from 0–(N–1), or 0-8) based upon those inputs. Spreader 728 is a very simple example of a spreader suitable for use as spreader 628 (FIG. 6). Other types of logic gates can be used. However, XOR gates provide a simple circuit that works well for this function. XNOR gates can also be used, in addition other combinatorial logic gates can be used. In most applications, more that the two levels of combinatorial gates shown here will be employed to allow for greater spreading. It is within the scope of this aspect of the present application that a spreader used to implement spreader 628 will have several times the number of outputs as inputs.

In one aspect, spreader 728 can be an XOR spreader that is essentially a phase shifter logic consisting of series of XOR gates that are generated based on a defined randomization function. The randomization function is generated to correspond to the circuitry under test. The randomization function can be determined manually or with the use of automation tools. The combinatorial circuitry in spreader 728 is then an implementation of the randomization function. Because the randomization is user controlled (and selected with or without the use of ATPG tools) it can be optimized to give best results in terms of peak coverage and pattern count, while avoiding significant area overhead burden. The randomization factor or the correlation factor of the spreader logic is user controlled. The randomization factor can be defined based on the measure of the random resistance testability of the design of the circuit to be tested.

In addition, the randomization introduced by the XOR based spreader logic breaks down the correlation introduced by the 1:M method and thereby enables a more significant reduction (K<P<N) in the number of actual control scan flops required for the same number (N) of test-points. Because the spreader is combinatorial logic, ATPG tools can determine what inputs are necessary to provide full test coverage of the circuitry receiving the output of the spreader (e.g. circuit 612 of FIG. 6).

Figures 8, 9:
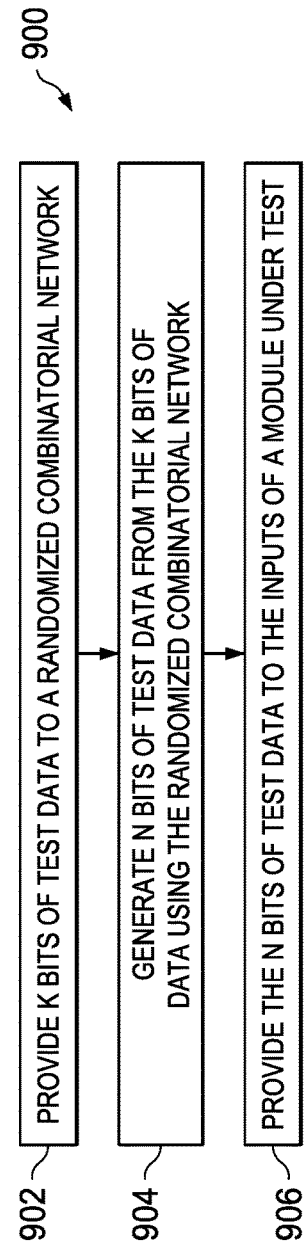
FIG. 8 is a chart comparing different configurations of inserted test points.
FIG. 9 is a flow diagram illustrating a method aspect of the present application.

FIG. 8 is a chart 800 comparing different configurations of inserted test points. The data is derived from design simulations using a 45 nanometer semiconductor process to model a signal processing circuit function with 40,000 flip flops. Line 802 shows the data for a 1-to-1 configuration, like that of FIG. 3. Line 802 indicates that this configuration yields a test coverage of 92.82% and has a test insertion total area of 40,144.9 $\mu m^2$. Chart 800 also shows the pattern count, number of flops, sequential logic area and combinational logic area (e.g. the area of XOR spreader 628 of FIG. 6) for this experimental device. Lines 804 and 806 show the data for two configurations similar to circuit 500 of FIG. 5 with line 804 showing P=500 and M=12 and line 806 showing P=12 and M=500. For lines 804 and 806, the coverage is 92.53% and 89.98%, respectively, and the total area is 3456 $\mu m^2$ and 82.944 $\mu m^2$. For line 806, the area consumed is diminished, but the test coverage is significantly degraded.

Lines 808, 810 and 812 show data for three versions of a configuration such as shown in FIG. 6 where K is equal to 500, 50 and 5, respectively. The total area consumed is 10123.1 $\mu m^2$, 1046.8 $\mu m^2$ and 97.16 $\mu m^2$, respectively. The test coverage data is 92.81%, 92.80% and 92.80%, respectively. Thus, in this example, all three versions of the XOR spreader configuration aspect provide nearly the coverage of the 1-to-1 mode. However, all three versions consume less area, particularly for the configuration of line 812. The configuration of line 812 only consumes 97.16 $\mu m^2$. This area consumption is a factor of over 400 times less than that of the 1-to-1 configuration. Thus, the XOR spreader configurations provide nearly the coverage of the 1-to-1 type of insertion point, but use far less valuable integrated circuit area. In this example, use of the XOR based spreader mode has proven to be an efficient low area overhead test-point insertion methodology that drastically reduces the area overhead incurred (by a factor of more than 400×) for test point insertion when compared to the conventional 1:1 and 1:M methods. In addition, by drastically reducing the number of control scan flops from 5808 in the 1-to 1 mode (line 802) to 5 in the K=5 XOR spreader mode (line 812), use of the arrangements of the present application drastically lowers the complexity and power consumption necessary for providing clocking signals to the test insertion point.

FIG. 9 is a flow diagram illustrating a method aspect of the present application. Method 900 begins with step 902 where K bits of test data are provided by, for example, at test module like test module 620 of FIG. 6 to a randomized combinatorial network, for example, XOR spreader 628 of FIG. 6. In step 904, the combinatorial network provides N bits of test data from the provided K bits of test data. In step 906, the N bits of test data generated by the combinatorial network in step 904 are provided to a module under test.

In an example aspect, an integrated circuit includes a plurality of K storage elements for storing test data having K bits, the storage elements having an output configured to provide one of the K bits. The integrated circuit also includes a combinatorial network having K inputs coupled to one output of the K storage elements, the combinatorial network configured to provide N output bits on N outputs, the K output bits deriving from the K bits, where N is greater than K. The integrated circuit also includes a multiplexor having a first N inputs coupled to the output of a first module and a second N inputs, the second N inputs coupled to the N outputs of the combinatorial network, the multiplexor having N outputs and selectively providing data on the first N inputs and the second N inputs on the N outputs. The integrated circuit also includes a second module having N inputs coupled to the N outputs of the multiplexor.

In another example aspect, the combinatorial network is an XOR network.

In another example aspect, the combinatorial network is randomized.

In yet another example aspect, the test data is loaded into the K storage elements serially.

In another example aspect, the K storage elements are flip-flops.

In another example aspect, the multiplexor includes a third N inputs in which each of the K bits is of the K storage elements is connected to more than one of each of the third N inputs.

In yet another example aspect, a circuit includes a plurality of K storage elements for storing test data having K bits, each storage element having an output configured to provide one of the K bits. The circuit also includes a combinatorial network having K inputs, each input coupled to one output of the K storage elements, the combinatorial network configured to provide N output bits on N outputs, the N output bits deriving from the K bits, where N is greater than K. The circuit also includes a multiplexor having a first N inputs coupled to the output of a first module and a second N inputs, the second N inputs coupled to the N outputs of the combinatorial network, the multiplexor having N outputs and selectively providing data on the first N inputs and the second N inputs on the N outputs. The circuit also includes a second module having N inputs coupled to the N outputs of the multiplexor.

In another example aspect, the first module and the second module are formed in separate integrated circuits.

In another example aspect, the separate integrated circuits are coupled to a circuit board.

In yet another example aspect, the combinatorial network is an XOR network.

In another example aspect, the combinatorial network is randomized.

In another example aspect, the test data is loaded into the K storage elements serially.

In yet another example aspect, the K storage elements are flip-flops.

In another example aspect, the first module and the second module are in an integrated circuit.

In another example aspect, a method includes providing K bits of test data to a combinatorial circuit. The method further includes generating N bits of test data using the combinatorial circuit, where N is greater than K. The method further includes providing the N bits of test data to a module under test.

In another example aspect, the method further includes selectively providing normal data and the N bits of test data to the module under test using a multiplexor.

In another example aspect, the combinatorial circuit is an XOR spreader circuit.

In yet another example aspect, the combinatorial circuit is randomized.

In another example aspect, the combinatorial circuit is configured to reduce correlation effects.

In another example aspect, the method further includes storing the K bits of test data in K storage elements.

What is claimed is:

1. A circuit comprising:
   a first storage element storing at least a first bit of K bits, wherein K is an integer greater than 1, wherein the K bits are test data;
   a second storage element storing at least a second bit of K bits;
   a combinatorial network coupled to the first storage element and the second storage element, the combinatorial network configured to provide N output bits on N outputs, wherein each N output bit is provided on a respective output of the N outputs, the N output bits are derived from the K bits, N is an integer greater than K;
   a multiplexor having a first set of inputs that is adapted to be coupled to an output of a first module and a second set of N inputs, wherein each input in the second set of N inputs is coupled to a respective output of the N outputs of the combinatorial network.

2. The circuit of claim 1 in which the combinatorial network is an XOR network.

3. The circuit of claim 1 in which the combinatorial network is randomized.

4. The circuit of claim 1 in which the test data is loaded into the K storage elements serially.

5. The circuit of claim 1 in which the K storage elements are flip-flops.

6. The circuit of claim 1, further comprising:
   a second module coupled to the multiplexor.

7. The circuit of claim 6 in which the first module and the second module are formed in separate integrated circuits.

8. The circuit of claim 7 in which the separate integrated circuits are coupled to a circuit board.

9. A method of providing data, comprising:
   providing, by a plurality of storage elements, K bits of test data to a combinatorial network, wherein K is an integer greater than 1;
   generating, by the combinatorial network, N output bits of the data as test data, from the K bits, where N is an integer greater than K;
   transmitting, by the combinatorial network, the N output bits to a multiplexor;
   selectively providing, by the multiplexor, in a test mode, the N output bits as the test data to a circuit; and
   wherein the multiplexor is operable, in a non-test mode, for selectively coupling N output bits as normal data as the data from a module to the circuit.

10. The method of claim 9 further including, in the non-test mode, selectively coupling as the normal data the N outputs bits from the module to the circuit using the multiplexor.

11. The method of claim 9 in which the combinatorial circuit is an XOR spreader circuit.

12. The method of claim 9 in which the combinatorial circuit is randomized.

13. The method of claim 12 in which the combinatorial circuit is configured to reduce correlation effects.

14. The method of claim 9 further comprising storing the K bits of test data in the plurality of storage elements.

* * * * *